United States Patent
Farris, III et al.

(10) Patent No.: US 8,563,850 B2
(45) Date of Patent: Oct. 22, 2013

(54) TANDEM PHOTOVOLTAIC CELL AND METHOD USING THREE GLASS SUBSTRATE CONFIGURATION

(75) Inventors: Chester A. Farris, III, Yorba Linda, CA (US); Howard W. H. Lee, Saratoga, CA (US); Robert Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 657 days.

(21) Appl. No.: 12/723,455

(22) Filed: Mar. 12, 2010

(65) Prior Publication Data

US 2010/0229921 A1   Sep. 16, 2010

Related U.S. Application Data

(60) Provisional application No. 61/160,515, filed on Mar. 16, 2009.

(51) Int. Cl.
*H01L 27/142* (2006.01)
*H01L 25/00* (2006.01)

(52) U.S. Cl.
USPC ........... 136/249; 136/259; 136/251; 136/262; 136/264; 136/265

(58) Field of Classification Search
USPC .......... 136/249, 259, 261, 262, 263, 264, 265
See application file for complete search history.

(56) References Cited

U.S. PATENT DOCUMENTS

| | | | |
|---|---|---|---|
| 4,239,553 A | 12/1980 | Barnett et al. |
| 4,446,916 A | 5/1984 | Hayes |
| 4,488,948 A | 12/1984 | Larson et al. |
| 4,658,086 A | 4/1987 | McLeod et al. |
| 4,710,589 A | 12/1987 | Meyers et al. |
| 4,782,377 A | 11/1988 | Mahan |
| 4,996,108 A | 2/1991 | Divigalpitiya et al. |
| 5,125,984 A | 6/1992 | Kruehler et al. |
| 5,261,968 A | 11/1993 | Jordan |
| 5,261,969 A | 11/1993 | Stanbery |
| 5,397,401 A | 3/1995 | Toma et al. |
| 5,501,744 A | 3/1996 | Albright et al. |

(Continued)

FOREIGN PATENT DOCUMENTS

| | | |
|---|---|---|
| GB | 2332684 A | 6/1999 |
| WO | WO 2009/149204 A1 | 12/2009 |

(Continued)

OTHER PUBLICATIONS

International Search Report and Written Opinion for patent application PCT/US10/27342 (May 17, 2010).

(Continued)

*Primary Examiner* — Jonathan Johnson
*Assistant Examiner* — Bethany Lambright
(74) *Attorney, Agent, or Firm* — Kilpatrick Townsend and Stockton LLP

(57) ABSTRACT

A tandem photovoltaic cell device is disclosed including an upper and lower cell. The lower cell may comprise a glass substrate and overlying layers that may include an electrode, absorber, window layer, and a transparent conductive oxide layer. The upper cell may comprise an intermediate glass substrate and overlying layers that may include a transparent conductor, an absorber, a window layer, a second conductive oxide layer, and an upper glass material. The cells may be coupled with an optical coupling material, and edge sealing material may be disposed between the glass substrates for both the upper and lower cells.

17 Claims, 5 Drawing Sheets

(56) References Cited

U.S. PATENT DOCUMENTS

| | | | |
|---|---|---|---|
| 5,536,333 | A | 7/1996 | Foote et al. |
| 5,578,503 | A | 11/1996 | Karg et al. |
| 5,665,175 | A | 9/1997 | Safir |
| 5,733,382 | A | 3/1998 | Hanoka |
| 5,834,331 | A | 11/1998 | Razeghi |
| 6,040,521 | A | 3/2000 | Kushiya et al. |
| 6,066,797 | A | 5/2000 | Toyomura et al. |
| 6,257,175 | B1 | 7/2001 | Mosher et al. |
| 6,288,325 | B1 | 9/2001 | Jansen et al. |
| 6,310,281 | B1 | 10/2001 | Wendt et al. |
| 6,320,115 | B1 | 11/2001 | Kataoka et al. |
| 6,328,871 | B1 | 12/2001 | Ding et al. |
| 6,350,946 | B1 | 2/2002 | Miyake et al. |
| 6,548,751 | B2 | 4/2003 | Sverdrup et al. |
| 7,141,863 | B1 | 11/2006 | Compaan et al. |
| 7,855,089 | B2 | 12/2010 | Farris, III et al. |
| 7,863,074 | B2 | 1/2011 | Wieting |
| 7,910,399 | B1 | 3/2011 | Wieting |
| 8,232,134 | B2 | 7/2012 | Lee |
| 2001/0050234 | A1 | 12/2001 | Shiepe |
| 2002/0026955 | A1 | 3/2002 | Ouchida et al. |
| 2002/0038663 | A1 | 4/2002 | Zenko et al. |
| 2003/0079772 | A1* | 5/2003 | Gittings et al. ............... 136/251 |
| 2003/0227017 | A1 | 12/2003 | Yasuno |
| 2005/0006228 | A1 | 1/2005 | Hyun |
| 2005/0056312 | A1* | 3/2005 | Young et al. ............... 136/258 |
| 2005/0109392 | A1 | 5/2005 | Hollars |
| 2005/0150542 | A1 | 7/2005 | Madan |
| 2005/0183962 | A1 | 8/2005 | Oakes |
| 2006/0037641 | A1 | 2/2006 | Kibbel et al. |
| 2006/0130890 | A1 | 6/2006 | Hantschel et al. |
| 2006/0180197 | A1 | 8/2006 | Gui et al. |
| 2006/0180464 | A1 | 8/2006 | Griffin |
| 2006/0220059 | A1 | 10/2006 | Satoh et al. |
| 2007/0089782 | A1 | 4/2007 | Scheuten et al. |
| 2007/0151596 | A1 | 7/2007 | Nasuno et al. |
| 2007/0160770 | A1 | 7/2007 | Stanbery |
| 2007/0169810 | A1 | 7/2007 | Van Duren et al. |
| 2008/0023059 | A1* | 1/2008 | Basol ............................ 136/244 |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0173390 | A1 | 7/2008 | Narasimhan et al. |
| 2008/0216885 | A1 | 9/2008 | Frolov et al. |
| 2008/0257751 | A1 | 10/2008 | Smola et al. |
| 2009/0020149 | A1 | 1/2009 | Woods et al. |
| 2009/0194165 | A1* | 8/2009 | Murphy et al. ............... 136/260 |
| 2009/0301562 | A1 | 12/2009 | Lee |
| 2009/0308437 | A1 | 12/2009 | Woods et al. |
| 2010/0051090 | A1 | 3/2010 | Lee |
| 2010/0078059 | A1 | 4/2010 | Lee |
| 2010/0099214 | A1 | 4/2010 | Buquing |
| 2010/0132775 | A1* | 6/2010 | Le et al. ....................... 136/255 |
| 2010/0236610 | A1* | 9/2010 | Stancel et al. ................ 136/251 |
| 2010/0307552 | A1 | 12/2010 | Kohnke et al. |
| 2011/0017257 | A1 | 1/2011 | Lee et al. |
| 2011/0017298 | A1 | 1/2011 | Lee |
| 2011/0168245 | A1 | 7/2011 | Lee |
| 2012/0199065 | A1 | 8/2012 | Wieting et al. |
| 2012/0204939 | A1 | 8/2012 | Lee et al. |

FOREIGN PATENT DOCUMENTS

| | | |
|---|---|---|
| WO | WO 2009/158187 A1 | 12/2009 |
| WO | WO 2010/025291 A2 | 3/2010 |
| WO | WO 2010/039727 A1 | 4/2010 |
| WO | WO 2010/107705 A1 | 9/2010 |

OTHER PUBLICATIONS

Ellmer, K., et al., "Copper Indium Disulfide Solar Cell Absorbers Prepared in a One-Step Process by Reactive Magnetron Sputtering from Copper and Indium Targets", Thin Solid Films, 2002, vol. 413, pp. 92-97.

Gee, J. M., et al., "31%-Efficient GaAs/ Silicon Mechanically Stacked, Multijunction Concentrator Solar Cell", 20th IEEE Photovoltaic Specialist Conference, IEEE Publishing, New York, NY, 1988, pp. 754-758.

Martil, I., et al., "Growth and physical properties of CuGaSe2 thin films by r.f. sputtering", Journal of Materials Science Letter, 1990, vol. 19, pp. 237-240.

Meyers, P.V., et al., "Polycrystalline CdTe on CuInSe2 Cascaded Solar Cells", Conference Record of the Twentieth IEEE Photovoltaic Specialists Conference, Las Vegas, NV, Sep. 26-30, 1988, pp. 1448-1451, vol. 2.

Onuma, Y., et al., "Preparation and Characterization of CuInS2 Thin Films Solar Cells with Large Grain", Solar Energy Materials & Solar Cells, 2001, vol. 69, pp. 261-269.

Rostan, P., et al. "Formation of Transparent and Ohmic ZnO:Al/ MoSe2 Contacts for Bifacial Cu (In, Ga)Se2 Solar Cells and Tandem Structures", Thin Solid Films, 2005, vol. 480-481, pp. 67-70.

Schorr, S., et al., "Electronic Band Gap of Zn2x(CuIn)1-xX2 Solid Solution Series (X=S, Se, Te)", Journal of Alloys and Compounds, 2006, vol. 414, No. 1-2 , pp. 26-30.

Symko-Davies, "NREL High-Performance Photovoltaic Project Kickoff Meeting, Identifying Critical Pathways", Oct. 18, 2001, 121 pages.

Wu, X., et al. "13.9%-Efficient CdTe Polycrystalline Thin-Film Solar Cells with an Infrared Transmission of ~ 50%", Progress in Photovoltaics: Research and Applications, 2006, vol. 14, pp. 471-483.

Young, D. L., et al. "Interconnect Junctions for Thin-Film Tandem Solar Cells", Proceedings of the 3rd World Conference on Photovoltaic Energy Conversion, Osaka, Japan, May 11, 2003, vol. 1, pp. 27-30.

International Search Report and Written Opinion for PCT Patent Application No. PCT/US2009/055243, mailed on Mar. 11, 2011, 11 pages.

International Search Report & Written Opinion of PCT Patent Application No. PCT/US/09/558829, date of mailing Nov. 25, 2009, 12 pages.

International Search Report & Written Opinion of PCT Patent Application No. PCT/US09/46802, mailed on Jul. 31, 2009, 11 pages total.

International Search Report and Written Opinion for PCT Patent Application No. PCT/US2009/04616 mailed on Jul. 27, 2009, 9 pages.

Final Office Action of Sep. 9, 2011 for U.S. Appl. No. 12/588,108, 20 pages.

Advisory Action of Aug. 19, 2011 for U.S. Appl. No. 12/512,978, 3 pages.

Final Office Action of Jun. 8, 2011 for U.S. Appl. No. 12/512,978, 16 pages.

Final Office Action of May 12, 2011 for U.S. Appl. No. 12/512,979, 14 pages.

Final Office Action of Apr. 12, 2011 for U.S. Appl. No. 12/562,086, 26 pages.

Non-Final Office Action of Mar. 1, 2011 for U.S. Appl. No. 12/558,108; 21 pages.

Non-Final Office Action of Dec. 23, 2010 for U.S. Appl. No. 12/512,978, 13 pages.

Final Office Action of Dec. 23, 2010 for U.S. Appl. No. 12/475,858, 28 pages.

Non-Final Office Action of Dec. 22, 2010 for U.S. Appl. No. 12/271,704; 14 pages.

Non-Final Office Action of Sep. 2, 2010 for U.S. Appl. No. 12/562,086; 14 pages.

Non-Final Office Action of Aug. 30, 2010 for U.S. Appl. No. 12/512,979, 13 pages.

Non-Final Office Action of Aug. 17, 2010 for U.S. Appl. No. 12/475,858, 22 pages.

* cited by examiner

TANDEM PHOTOVOLTAIC CELL AND METHOD USING THREE GLASS SUBSTRATE CONFIGURATION

CROSS-REFERENCES TO RELATED APPLICATIONS

This application claims priority to U.S. Provisional Patent Application No. 61/160,515, filed Mar. 16, 2009 entitled "TANDEM PHOTOVOLTAIC CELL AND METHOD USING THREE GLASS SUBSTRATE CONFIGURATION" by inventors Chester A Farris III, Howard W. H. Lee, and Robert Wieting, commonly assigned and incorporated by reference herein for all purposes.

BACKGROUND OF THE INVENTION

The present invention relates generally to photovoltaic materials and manufacturing method. More particularly, the present invention provides a method and structure for manufacture of high efficiency multi junction thin film photovoltaic cells. Merely by way of example, the present method and materials include absorber materials made of copper indium disulfide species, copper tin sulfide, iron disulfide, or others for multi junction cells.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, the present invention provides a method and structure for manufacture of high efficiency multi junction thin film photovoltaic cells. Merely by way of example, the present method and materials include absorber materials made of copper indium disulfide species, copper tin sulfide, iron disulfide, or others for multi junction cells.

In a specific embodiment, the present invention provides a tandem photovoltaic cell device. The device includes a lower cell configured for substantial independent operation of an upper cell. In a preferred embodiment, the lower cell has a lower glass substrate material and a lower electrode layer made of a reflective material overlying the glass material. The lower cell also has a lower absorber layer overlying the lower electrode layer. In a preferred embodiment, the absorber layer made of a semiconductor material has a first band gap energy in a range of Eg=0.7 to 1 eV but can be slightly larger such as 1.05 eV and greater. The lower cell includes a lower window layer overlying the lower absorber layer, a lower transparent conductive oxide layer overlying the lower window layer, and a first optical coupling material comprising first ethylene vinyl acetate overlying the lower transparent conductive oxide layer. In a specific embodiment, the device also has the upper cell coupled to the lower cell. The upper cell has an intermediary glass substrate material, which has a thickness, a lower surface and an upper surface. In a specific embodiment, the thickness is about 1.1 millimeter and less. The lower surface is overlying the optical coupling material. The upper cell also has a first upper transparent conductor layer overlying the upper surface of the intermediary glass substrate material and an upper p type absorber layer overlying the first upper transparent conductor layer.

In a preferred embodiment, the p type conductor layer is made of a semiconductor material having a second band gap energy in a range of Eg=1.5 to 1.9 eV. The upper cell also has an upper n type window layer overlying the upper p type absorber layer. The upper cell has a second upper transparent conductive oxide layer overlying the upper n type window layer. The upper cell has a second optical coupling material comprising first ethylene vinyl acetate overlying the second upper transparent conductive oxide layer. The upper cell has an upper glass material overlying the upper transparent conductive oxide layer and the second optical coupling material sandwiched in between them. More specifically, the upper glass material is overlying the second optical coupling material which itself overlies the upper transparent electrode. In a specific embodiment, the device has a first edge sealing material provided between the lower glass substrate material and the lower surface of the intermediary glass substrate material. As an example, the first edge sealing material can be a product made by Tru Seal Technologies, Inc., but can be other materials. In a specific embodiment, the device has a second edge sealing material provided between the upper glass material and the upper surface of the intermediary glass substrate material. Again as an example, the second edge sealing material can be a product made by Tru Seal Technologies, but can be other materials. An example of such product is called Duraseal™, which is a cost-effective system offering superior thermal efficiency, made by Tru Seal Technologies, Inc.

Many benefits may be achieved by ways of present invention. For example, the present invention can use starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. In a specific embodiment, the upper cell is configured independent from the lower cell and coupled together via an intermediary glass layer. In a preferred embodiment, the upper cell configuration occurs using a preferred electrode layer, which can be combined or varied. In a specific embodiment, the present upper and lower solar cell can be manufactured independently and subsequently electronically configured using a technique described in "Multi-Junction Solar Module and Method for Current Matching Between a Plurality of First Photovoltaic Devices and Second," where Lee, Howard W. H. and Farris, III, Chester A. are inventors, and is listed as U.S. Provisional Patent Application No. 61/092,383 filed Aug. 27, 2008, commonly assigned, and hereby incorporated by reference herein. Additionally, the present method uses environmentally friendly materials that are relatively less toxic than other thin-film photovoltaic materials according to a specific embodiment. Depending on the embodiment, one or more of the benefits can be achieved. These and other benefits will be described in more detailed throughout the present specification and particularly below.

Merely by way of example, the present method and materials include absorber materials made of copper indium disulfide species, copper tin sulfide, iron disulfide, or others for single junction cells or multi junction cells. Other materials can also be used according to a specific embodiment.

DETAILED DESCRIPTION OF THE INVENTION

According to embodiments of the present invention, a method and a structure for forming thin film semiconductor materials for photovoltaic applications are provided. More particularly, the present invention provides a method and structure for manufacture of high efficiency multi junction thin film photovoltaic cells. Merely by way of example, the present method and materials include absorber materials made of copper indium disulfide species, copper tin sulfide, iron disulfide, or others for multi junction cells.

Figure 1:
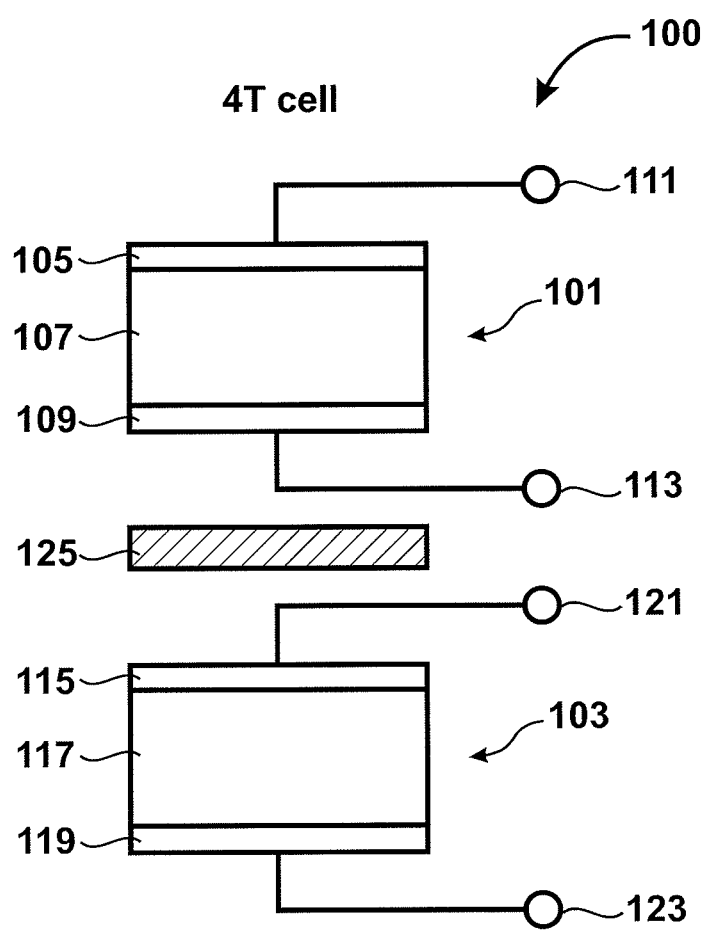
FIG. 1 is a simplified diagram of four terminal multi junction photovoltaic cell using three glass layers according to an embodiment of the present invention.

FIG. 1 is a simplified diagram 100 of a four terminal multi junction photovoltaic cell according to an embodiment of the present invention. The diagram is merely an illustration and should not unduly limit the scope of the claims herein. One of ordinary skill in the art would recognize other variations, modifications, and alternatives. As shown, the present invention provides a multi junction photovoltaic cell device 100. The device includes a lower cell 103 and an upper cell 101, which is operably coupled to the lower cell and mechanically coupled to each other via a glass substrate 125, which is a thin layer of glass or other suitable material. In a specific embodiment, the term lower and upper are not intended to be limiting but should be construed by plain meaning by one of ordinary skill in the art. In general, the upper cell is closer to a source of electromagnetic radiation, than the lower cell, which receives the electromagnetic radiation after traversing through the upper cell. Additionally, each of the cells is manufactured separately and then coupled to each other, which leads to further ease in manufacturing, and the like. Of course, there can be other variations, modifications, and alternatives.

In a specific embodiment, the lower cell includes a lower glass substrate material 119, e.g., transparent glass, soda lime glass, or other optically transparent substrate or other substrate, which may not be transparent. The lower cell also includes a lower electrode layer made of a reflective material overlying the glass material. In a specific embodiment, the lower electrode layer can be an aluminum material, gold material, silver material, molybdenum, combinations thereof, and others. Of course, there can be other variations, modifications, and alternatives.

The lower cell includes a lower absorber layer overlying the lower electrode layer. In a preferred embodiment, the lower absorber layer is made of a copper indium diselenide, or copper indium gallium diselenide, and the like. As shown, the absorber and electrode layer are illustrated by reference numeral 117. In a specific embodiment, the absorber layer is made of a first semiconductor material having a first band gap energy in a range of Eg=0.7 to 1 eV, but can be slightly greater than 1 eV or others. In a specific embodiment, the lower cell includes a lower window layer overlying the lower absorber layer and a lower transparent conductive oxide layer 115 overlying the lower window layer. In a specific embodiment, the lower window layer can be a cadmium sulfide or other suitable material. In a preferred embodiment, the lower window layer is an n-type cadmium sulfide and the lower transparent conductive oxide layer is a zinc oxide, but can be others. Of course, there are other variations, modifications, and alternatives.

In a specific embodiment, the lower cell has a first optical coupling material overlying the lower transparent conductive oxide layer. In a specific embodiment, the optical coupling material can be an ethylene vinyl acetate, commonly called EVA, poly vinyl acetate, commonly called PVA, and others. The coupling material is applied using a suitable thickness and provides mechanical support and optical coupling between the lower transparent conductive oxide layer and overlying layer, which will be described in more detail below. Of course, there are other variations, modifications, and alternatives.

In a specific embodiment, the upper cell is coupled to the lower cell via an intermediary glass substrate material. In a specific embodiment, the intermediary glass substrate material has a thickness, a lower surface, and an upper surface. In a preferred embodiment, the thickness is about 1.1 millimeters or less. The lower surface is overlying the optical coupling material. In a specific embodiment, the intermediary glass substrate material can be a low iron glass, which is 1 millimeter or less. Of course, there can be other variations, modifications, and alternatives.

In a specific embodiment, the upper cell has a first upper transparent conductor layer overlying the upper surface of the intermediary glass material. In a specific embodiment, the upper transparent conductor layer can be a zinc oxide, ZnO:Al (AZO), or others. In a specific embodiment, the upper transparent conductor can be a p+ type transparent conductor layer. In a specific embodiment, the upper cell is a p+ type transparent conductor layer 109 overlying the lower transparent conductive oxide layer. In a preferred embodiment, the p+ type transparent conductor layer is characterized by traversing electromagnetic radiation in at least a wavelength range from about 700 to about 630 nanometers and filtering electromagnetic radiation in a wavelength range from about 490 to about 450 nanometers. Of course, there can be other variations, modifications, and alternatives.

In a specific embodiment, the upper cell also has an upper p type absorber layer overlying the first upper transparent conductor layer. In a preferred embodiment, the p type absorber layer is made of a second semiconductor material characterized by a second band gap energy in a range of Eg=1.5 to 1.9 eV, but can be others. The upper cell also has an upper n type window layer overlying the upper p type absorber layer. Referring again to FIG. 1, the window and absorber are illustrated by reference numeral 107. The upper cell also has a second upper transparent conductive oxide layer 105 overlying the upper n-type window layer and an upper glass material overlying the upper transparent conductive oxide layer. In a specific embodiment, the second upper transparent conductive layer is a ZnO:Al, or other suitable material. The upper glass layer is a low iron water white glass that has a thickness of about 2 millimeters and greater according to a specific embodiment. Of course, there can be other variations, modifications, and alternatives.

In a specific embodiment, the device has a first edge sealing material provided between the lower glass substrate material and the lower surface of the intermediary glass substrate material. As an example, the first edge sealing material can be a product made by Tru Seal Technologies, Inc., but can be other materials. In a specific embodiment, the device has a second edge sealing material provided between the upper glass material and the upper surface of the intermediary glass substrate material. Again as an example, the second edge sealing material can be a product made by Tru Seal Technologies, Inc., but can be other materials. Of course, there can be other variations, modifications, and alternatives.

In a specific embodiment, the multi junction photovoltaic cell includes four terminals. The four terminals are defined by reference numerals 111, 113, 121, and 123. Alternatively, the multi junction photovoltaic cell can also include three terminals, which share a common electrode preferably proximate to an interface region between the upper cell and the lower cell. In other embodiments, the multi junction cell can also include two terminals, among others, depending upon the application. Examples of other cell configurations are provided in U.S. Provisional Patent Application No. 60/988,414, filed Nov. 11, 2007, commonly assigned and hereby incorporated by reference herein. Of course, there can be other variations, modifications, and alternatives. Additionally, each cell is configured to supply matching currents that are described in "Multi-Junction Solar Module and Method for Current Matching Between a Plurality of First Photovoltaic Devices and Second," where Lee, Howard W. H. and Farris, III, Chester A. are inventors, and is listed as U.S. Provisional Patent Application No. 61/092,383 filed Aug. 27, 2008, commonly assigned, and hereby incorporated by reference herein. Further details of the four terminal cells can be found throughout the present specification and more particularly below.

Figure 2:
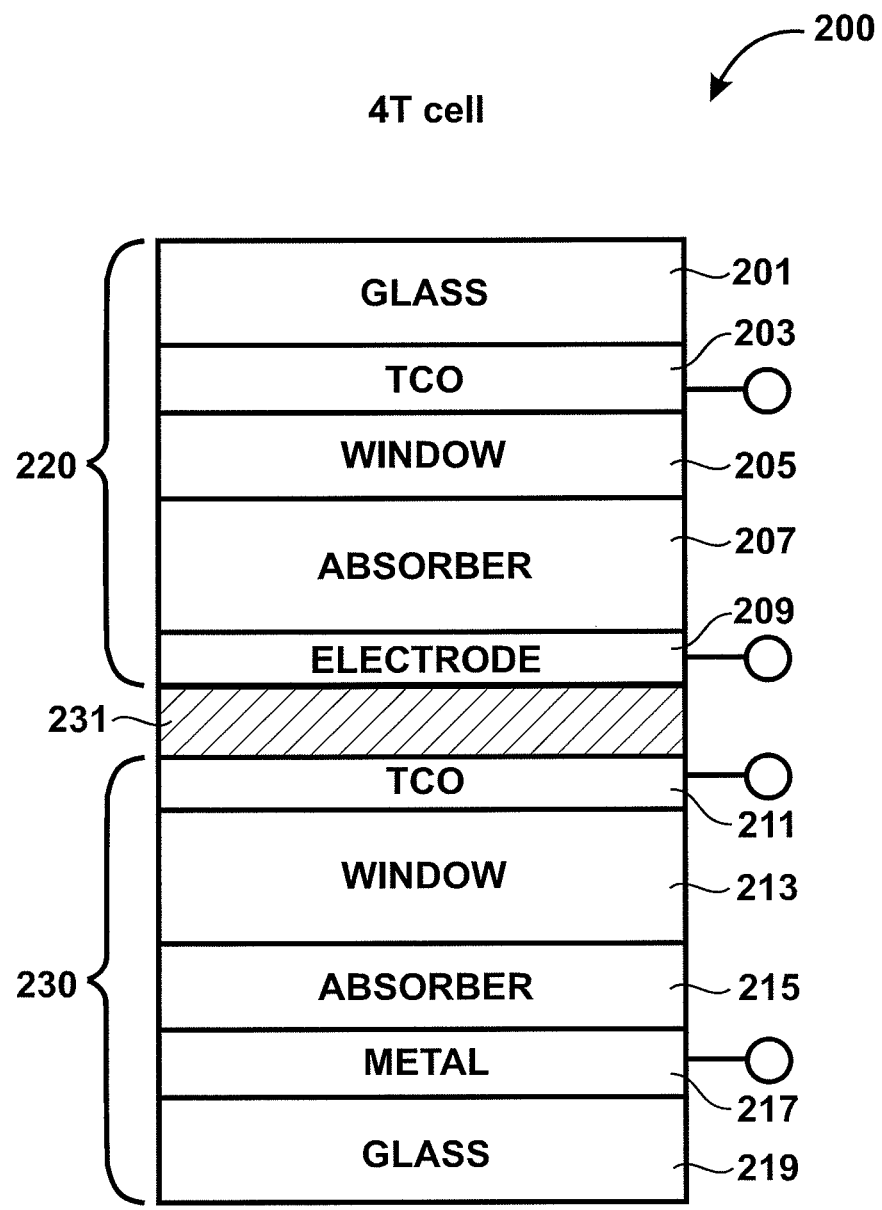
FIG. 2 is a simplified diagram of a cross-sectional view diagram of a multi junction photovoltaic cell according to an embodiment of the present invention.

FIG. 2 is a simplified diagram of a cross-sectional view diagram 200 of a multi-junction photovoltaic cell according to an embodiment of the present invention. The diagram is merely an illustration and should not unduly limit the scope of the claims herein. One of ordinary skill in the art would recognize other variations, modifications, and alternatives. As shown, the present invention provides a multi junction photovoltaic cell device 200. The device includes a lower cell 230 and an upper cell 220, which is operably coupled to the lower cell and mechanically coupled using a thin glass layer. In a specific embodiment, the term lower and upper are not intended to be limiting but should be construed by plain meaning by one of ordinary skill in the art. In general, the upper cell is closer to a source of electromagnetic radiation, than the lower cell, which receives the electromagnetic radiation after traversing through the upper cell. Of course, there can be other variations, modifications, and alternatives.

In a specific embodiment, the lower cell includes a lower glass substrate material 219, e.g., transparent glass, soda lime glass, or other optically transparent substrate or other substrate, which may not be transparent. The glass material or substrate can also be replaced by other materials such as a polymer material, a metal material, or a semiconductor material, or any combinations of them. Additionally, the substrate can be rigid, flexible, or any shape and/or form depending upon the embodiment. Of course, there can be other variations, modifications, and alternatives.

In a specific embodiment, the lower cell also includes a lower electrode layer 217 made of a reflective material overlying the glass material. The reflective material can be a single homogeneous material, composite, or layered structure according to a specific embodiment. In a specific embodiment, the lower electrode layer is made of a material selected from aluminum, silver, gold, molybdenum, copper, other metals, and/or conductive dielectric film(s), and others. The lower reflective layer reflects electromagnetic radiation that traversed through the one or more cells back to the one or more cells for producing current via the one or more cells. Of course, there can be other variations, modifications, and alternatives.

As shown, the lower cell includes a lower absorber layer 215 overlying the lower electrode layer. In a specific embodiment, the absorber layer is made of a semiconductor material having a band gap energy in a range of Eg=0.7 to 1 eV, but can be slightly bigger than 1 eV or others. In a specific embodiment, the lower absorber layer is made of the semiconductor material selected from $Cu_2SnS_3$, $FeS_2$, and $CuInSe_2$. The lower absorber layer comprises a thickness ranging from about a first determined amount to a second determined amount, but can be others. Depending upon the embodiment, the photovoltaic absorber of the lower cell can be formed using a copper indium gallium selenide (CIGS), which is a compound of copper, indium, gallium, and selenium, or a copper indium gallium sulfur selenide (CIGSS). Of course, there can be other variations, modifications, and alternatives.

In a specific embodiment, the low absorber material includes copper indium selenide ("CIS") and copper gallium selenide, with a chemical formula of $CuIn_xGa_{(1-x)}Se_2$, where the value of x can vary from 1 (pure copper indium selenide) to 0 (pure copper gallium selenide). In a specific embodiment, the CIGS material is characterized by a band gap varying with x from about 1.0 eV to about 1.7 eV, but may be others, although the band gap energy is preferably between about 0.7 to about 1.1 eV. In a specific embodiment, the CIGS structures can include those described in U.S. Pat. Nos. 4,611,091 and 4,612,411, which are hereby incorporated by reference herein, as well as other structures. Of course, there can be other variations, modifications, and alternatives.

In a specific embodiment, the lower cell includes a lower window layer overlying the lower absorber layer and a lower transparent conductive oxide layer 215 overlying the lower window layer. In a specific embodiment, the lower window layer is made of material selected from cadmium sulfide, cadmium zinc sulfide, or other suitable materials. In other embodiments, other n-type compound semiconductor layer include, but are not limited to, n-type group II-VI compound semiconductors such as zinc selenide, cadmium selenide, but can be others. Of course, there can be other variations, modifications, and alternatives. The transparent conductor oxide layer is indium tin oxide or other suitable materials.

In a preferred embodiment, the lower cell has a first optical coupling material overlying the transparent conductive oxide layer. In a specific embodiment, the optical coupling material can be an ethylene vinyl acetate, commonly called EVA, poly vinyl acetate, commonly called PVA, and others. Of course, there are other variations, modifications, and alternatives.

In a specific embodiment, the upper cell is coupled to the lower cell via an intermediary glass substrate material 231. In a preferred embodiment, the intermediary glass including upper cell is stand alone and coupled to the lower cell via the optical coupling material, such as EVA and the like. In a specific embodiment, the intermediary glass substrate material has a thickness, a lower surface, and an upper surface. In a preferred embodiment, the thickness is about 1.1 millimeters or less. The lower surface is overlying the optical coupling material. In a specific embodiment, the intermediary glass substrate material can be a low iron glass, which is 1 millimeter or less. Of course, there can be other variations, modifications, and alternatives.

In a specific embodiment, the upper cell includes a transparent conductor layer, which can be a p+ type transparent conductor layer 209 overlying the intermediary glass substrate material. In a specific embodiment, the transparent conductor layer can be ITO, AZO, or TFO, among others. In a specific embodiment, the transparent conductor layer is formed overlying the intermediary glass substrate. Of course, there can be other variations, modifications, and alternatives.

In a specific embodiment, the p+ type transparent conductor layer is characterized by traversing electromagnetic radiation in at least a wavelength range from about 700 to about 630 nanometers and filtering electromagnetic radiation in a wavelength range from about 490 to about 450 nanometers. In a preferred embodiment, the p+ type transparent conductor layer comprises a ZnTe species, including ZnTe crystalline material or polycrystalline material. In one or more embodiments, the p+ type transparent conductor layer is doped with at least one or more species selected from Cu, Cr, Mg, O, Al, or N, combinations, among others. In a preferred embodiment, the p+ type transparent conductor layer is characterized to selectively allow passage of red light and filter out blue light having a wavelength ranging from about 400 nanometers to about 450 nanometers. Also in a preferred embodiment, the p+ type transparent conductor layer is characterized by a band gap energy in a range of Eg=1.5 to 1.9 eV, or a band gap similar to the upper p type absorber layer. Of course, there can be other variations, modifications, and alternatives.

In a specific embodiment, the upper cell has an upper p type absorber layer 207 overlying the p+ type transparent conductor layer. In a preferred embodiment, the p type absorber layer made of a semiconductor material has a band gap energy in a range of Eg=1.5 to 1.9 eV, but can be others. In a specific embodiment, the upper p type absorber layer is selected from $CuInS_2$, $Cu(In,Al)S_2$, $Cu(In,Ga)S_2$, or other suitable materials. The absorber layer is made using suitable techniques, such as those described in U.S. Ser. No. 61/059,253 filed Jun. 5, 2008, commonly assigned, and hereby incorporated by reference here. Of course, there can be other variations, modifications, and alternatives.

Referring back to FIG. 2, the upper cell also has an upper n type window layer 205 overlying the upper p type absorber layer. In a specific embodiment, the n type window layer is selected from a cadmium sulfide (CdS), a zinc sulfide (ZnS), zinc selenium (ZnSe), zinc oxide (ZnO), zinc magnesium oxide (ZnMgO), or others and may be doped with impurities for conductivity, e.g., $n^+$ type. The upper cell also has an upper transparent conductive oxide layer 203 overlying the upper n type window layer according to a specific embodiment. The transparent oxide can be indium tin oxide and other suitable materials. For example, TCO can be selected from a group consisting of $In_2O_3$:Sn (ITO), ZnO:Al (AZO), $SnO_2$:F (TFO), and can be others.

In a specific embodiment, the upper cell also includes a cover glass 201 or upper glass material overlying the upper transparent conductive oxide layer. The upper glass material provides suitable support for mechanical impact and rigidity. The upper glass can be transparent glass or others. In a specific embodiment, a second coupling material couples the cover glass to the upper transparent conductive layer. In a preferred embodiment, the coupling material is EVA, but can be other materials. Of course, there can be other variations, modifications, and alternatives.

In a specific embodiment, the multi junction photovoltaic cell includes upper cell 220, which is coupled to lower cell 230, in a four terminal configuration. Alternatively as noted, the multi junction photovoltaic cell can also include three terminals, which share a common electrode preferably proximate to an interface region between the upper cell and the lower cell. In other embodiments, the multi junction cell can also include two terminals, among others, depending upon the application. Of course, there can be other variations, modifications, and alternatives. Further details of the four terminal cell can be found throughout the present specification and more particularly below.

Figure 3:
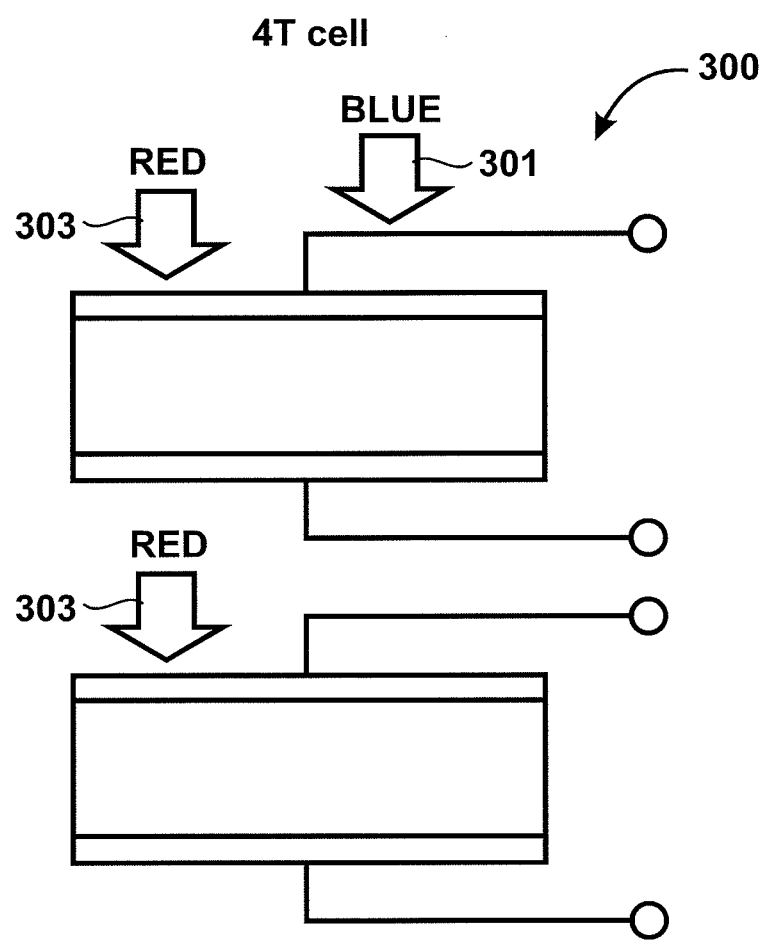
FIG. 3 is a simplified diagram illustrating a selective filtering process according to a specific embodiment of the present invention.

FIG. 3 is a simplified diagram illustrating a selective filtering process according to a specific embodiment of the present invention. The diagram is merely an illustration and should not unduly limit the scope of the claims herein. One of ordinary skill in the art would recognize other variations, modifications, and alternatives. As shown is a method for using a multi-junction photovoltaic cell, such as those described in the present specification. In a specific embodiment, the method includes irradiating sunlight through an upper cell operably coupled to a lower cell. As shown, the irradiation generally includes wavelengths corresponding to blue light 301 and red light 303, including slight or other variations. In a specific embodiment, the upper cell comprising a p+ type transparent conductor layer overlying a lower transparent conductive oxide layer. The p+ type conductor layer is also coupled to a p-type absorber layer and also has a substantially similar band gap as the absorber layer to effectively lengthen the absorber layer. As shown, the method selectively allows for traversing the electromagnetic radiation from the sunlight in at least a wavelength range from about 700 to about 630 nanometers through the p+ type transparent conductor layer. In a preferred embodiment, the p+ type conductor layer also filters out or blocks electromagnetic radiation in a wavelength range from about 490 to about 450 nanometers through the p+ type transparent conductor layer. Depending upon the embodiment, the method also includes other variations.

In a preferred embodiment, the present multi junction cell has improved efficiencies. As an example, the present multi junction cell has an upper cell made of $CuInS_2$ that has an efficiency of about 12.5% and greater or 10% and greater according to a specific embodiment. In a specific embodiment, the multi junction cell has an overall efficiency of 15% or greater or 18% or greater. The efficiency is commonly called a "power efficiency" measured by electrical power out/optical power in. Of course, there may also be other variations, modifications, and alternatives.

Figure 4:
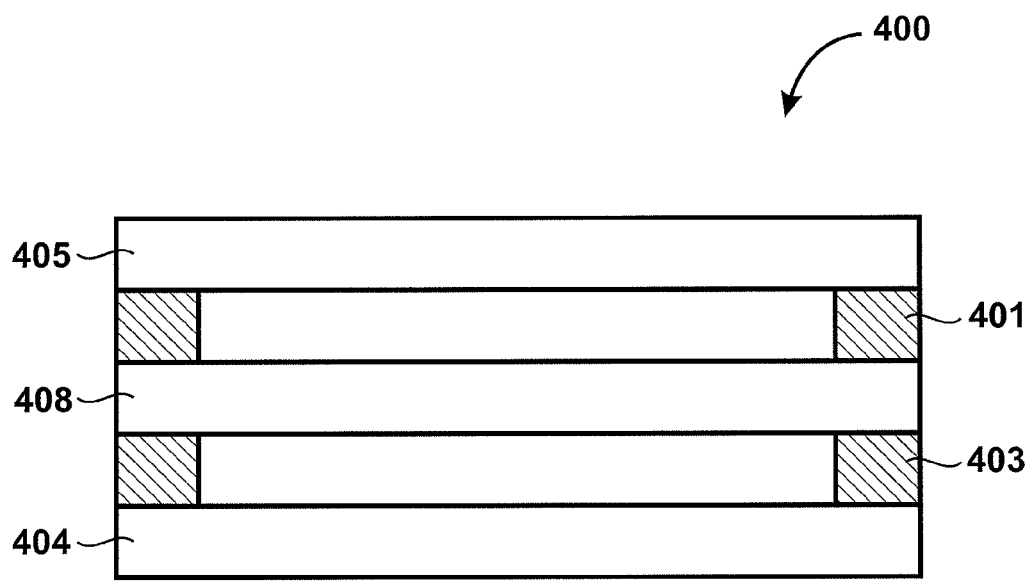
FIG. 4 is a simplified diagram illustrating a tandem cell according to an embodiment of the present invention.

FIG. 4 is a simplified diagram illustrating a tandem cell device 400 according to an embodiment of the present invention. The diagram is merely an illustration and should not unduly limit the scope of the claims herein. One of ordinary skill in the art would recognize other variations, modifications, and alternatives. As shown, the device includes an upper cell and a lower cell according to a specific embodiment. The device includes three glass layers, including cover glass 405, intermediary glass 408, and lower glass substrate 404, which are coupled together using coupling layers between the intermediary glass and lower cell and cover glass and upper cell according to a specific embodiment. In a preferred embodiment, each of the edges of the cells is sealed using an edge tape or the like.

In a specific embodiment, the device has a first edge sealing material 403 provided between the lower glass substrate material and the lower surface of the intermediary glass substrate material. As an example, the first edge sealing material can be a product made by Tru Seal Technologies, Inc., but can be other materials. In a specific embodiment, the device has a second edge sealing material 401 provided between the upper glass material and the upper surface of the intermediary glass substrate material. Again as an example, the second edge sealing material can be a product made by Tru Seal Technologies, Inc., but can be other materials. Of course, there can be other variations, modifications, and alternatives.

Figure 5:
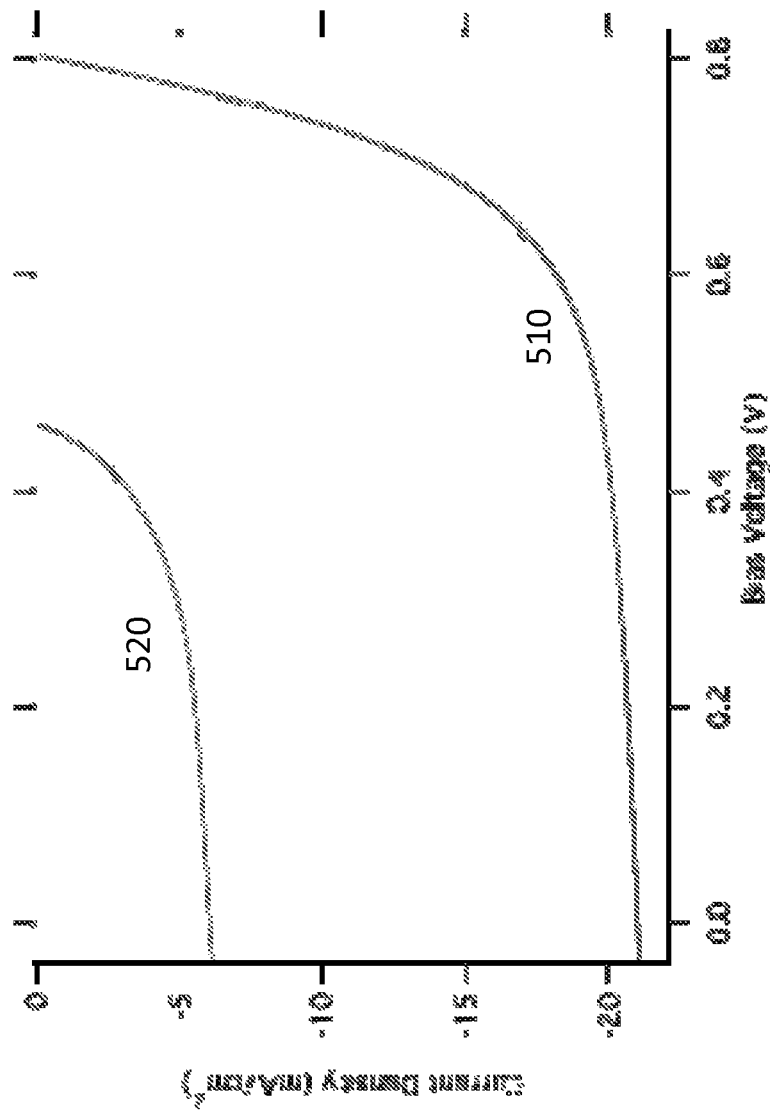
FIG. 5 is an exemplary solar cell IV characteristic diagram for both an upper cell and a lower cell in a 20×20 cm tandem cell structure according to an embodiment of the present invention

FIG. 5 is an exemplary solar cell IV characteristic diagram for both an upper cell and a lower cell in a 20×20 cm tandem cell structure according to an embodiment of the present invention. The diagram is merely an example, which should not unduly limit the claims herein. One skilled in the art would recognize other variations, modifications, and alternatives. In this example, the curve 510 is an IV characteristic plot deduced from the upper cell in the tandem structure, which includes a copper indium disulfide thin-film photovoltaic absorber. The current density of the upper cell is plotted against a bias voltage. The curve intersects the y-axis with a short circuit current value at about 21.5 mA/cm² and intersects a zero current line with a bias at about 0.8 V. In particular, the absorber layer associated with the upper cell is about 1.5 μm in thickness and an energy band-gap of about 1.55 eV. Based on standard formula, a cell conversion efficiency η can be estimated:

$$\eta = \frac{J_{SC} \cdot V_{OC} \cdot FF}{P_{in}(AM1.5)}$$

where $J_{SC}$ is the short circuit current density of the cell, $V_{OC}$ is the open circuit bias voltage applied, FF is the so-called fill factor defined as the ratio of the maximum power point divided by the open circuit voltage (Voc) and the short circuit current ($J_{SC}$). The fill factor for this device is 0.65. The input light irradiance ($P_{in}$, in W/m²) under standard test conditions [i.e., STC that specifies a temperature of 25° C. and an irradiance of 1000 W/m² with an air mass 1.5 (AM1.5) spectrum.] and the surface area of the solar cell (in m²). Thus, a 11.2% efficiency can be accurately estimated for the upper cell made from a method according to embodiments of the present invention As shown in FIG. 5, the curve 520 is IV characteristic plot of the lower cell in the same tandem structure. The lower cell comprises a thin-film photovoltaic absorber including copper indium (gallium) diselenide materials having an energy bandgap of about 1.05 eV. The lower cell is laminated below the upper cell with an intermediate glass substrate in between them. During the characterization measurement, the lower cell is only configured to receive the light that is transmitted through the upper cell, which is mainly a red band of sunlight spectrum. The curve intersects the y-axis with a short circuit current value at about 6.5 mA/cm² and intersects a zero current line with a bias at about 0.45 V. The fill factor for this device is 0.54. Similarly, an efficiency value can be deduced for this particular lower cell in such a tandem structure, which is about 2.3%. Therefore, the tandem structure cell has an effective power efficiency of about 13.5%. Of course, there can be other variations, modifications, and alternatives.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A tandem photovoltaic cell device comprising:
   a lower cell configured for substantial independent operation of an upper cell, the lower cell comprising:
   a lower glass substrate material;
   a lower electrode layer made of a reflective material overlying the glass material;
   a lower absorber layer overlying the lower electrode layer, the absorber layer made of a first semiconductor material having a first band gap energy (Eg) in a range of 0.7 to 1.1 eV;
   a lower window layer overlying the lower absorber layer;
   a lower transparent conductive oxide layer overlying the lower window layer;
   a first optical coupling material comprising first ethylene vinyl acetate overlying the lower transparent conductive oxide layer;
   the upper cell coupled to the lower cell, the upper cell comprising:
   an intermediary glass substrate material, the intermediary glass substrate material comprising a thickness, a lower surface, and an upper surface, the thickness being about 1.1 millimeter and less, the lower surface being overlying the optical coupling material;

a first upper transparent conductor layer overlying the upper surface of the intermediary glass substrate material;

an upper p type absorber layer overlying the first upper transparent conductor layer, the p type absorber layer made of a second semiconductor material having a second band gap energy (Eg) in a range of 1.5 to 1.9 eV;

an upper n type window layer overlying the upper p type absorber layer;

a second upper transparent conductive oxide layer overlying the upper n type window layer;

a second optical coupling material comprising first ethylene vinyl acetate overlying the second upper transparent conductive oxide layer; and an upper glass material overlying the upper transparent conductive oxide layer;

a first edge sealing material provided between the lower glass substrate material and the lower surface of the intermediary glass substrate material; and a second edge sealing material provided between the upper glass material and the upper surface of the intermediary glass substrate material.

2. The device of claim 1 wherein the lower absorber layer is made of the semiconductor material selected from $Cu_2SnS_3$, $FeS_2$, $CuInGaSe_2$, or $CuInSe_2$.

3. The device of claim 1 wherein the bottom cell is configured to absorb electromagnetic radiation in a red wavelength range.

4. The device of claim 1 wherein the lower glass substrate material is selected from a float glass or a soda lime glass.

5. The device of claim 1 wherein the lower electrode layer is made of a material selected from aluminum, silver, gold, or molybdenum.

6. The device of claim 1 wherein the lower window layer is made of material selected from an n-type material.

7. The device of claim 1 wherein the lower transparent conductive oxide layer is selected from a transparent indium oxide or a zinc oxide.

8. The device of claim 1 wherein the first upper transparent conductor layer comprises a p+ type transparent conductor layer is selected from a zinc bearing species or ZnO:Al (AZO).

9. The device of claim 1 wherein the first upper transparent conductor layer comprises a p+ type transparent conductor layer comprises a ZnTe species or ZnO:Al (AZO).

10. The device of claim 9 wherein the first upper transparent conductor layer comprises a p+ type transparent conductor layer is doped with at least one or more species selected from Cu, Cr, Mg, O, Al, or N.

11. The device of claim 1 wherein the intermediary glass material comprises a low iron glass.

12. The device of claim 1 wherein the intermediary glass material comprises the thickness of 1 millimeter and less.

13. The device of claim 1 wherein the upper p type absorber layer is selected from CuInS2, $Cu(In,Al)S_2$, or $Cu(In,Ga)S_2$.

14. The device of claim 1 wherein the upper n type window layer is selected from a cadmium sulfide (CdS), a zinc sulfide (ZnS), zinc selenium (ZnSe), zinc oxide (ZnO), or zinc magnesium oxide (ZnMgO).

15. The device of claim 1 wherein the second upper transparent conductive oxide layer is selected from $In_2O_3$:Sn (ITO), ZnO:Al (AZO), ZnO:B, or $SnO_2$:F (TFO).

16. The device of claim 1 wherein the upper glass material comprises a low iron water white glass having a thickness of 2 millimeters and greater.

17. The device of claim 1 wherein the first edge sealing material comprises a first edge tape and the second edge sealing material comprises a second edge tape.

* * * * *